(12) United States Patent
Ouchi et al.

(10) Patent No.: US 6,794,210 B2
(45) Date of Patent: Sep. 21, 2004

(54) METHOD FOR GROWING GAN COMPOUND SEMICONDUCTOR CRYSTAL AND SEMICONDUCTOR SUBSTRATE

(75) Inventors: Yoichiro Ouchi, Itami (JP); Hiroaki Okagawa, Itami (JP); Masahiro Koto, Itami (JP); Kazuyuki Tadatomo, Itami (JP)

(73) Assignee: Mitsubishi Cable Industries, Ltd., Amagasaki (JP)

( * ) Notice: Subject to any disclaimer, the term of this patent is extended or adjusted under 35 U.S.C. 154(b) by 0 days.

(21) Appl. No.: 10/703,330

(22) Filed: Nov. 7, 2003

(65) Prior Publication Data

US 2004/0094084 A1 May 20, 2004

Related U.S. Application Data

(62) Division of application No. 09/937,337, filed as application No. PCT/JP00/01718 on Mar. 21, 2000, now Pat. No. 6,700,179.

(30) Foreign Application Priority Data

Mar. 23, 1999 (JP) ............................................. 11-077239
Feb. 16, 2000 (JP) ........................................ 2000-037577

(51) Int. Cl.$^7$ ............................................. H01L 21/00
(52) U.S. Cl. ........................................................ 438/46
(58) Field of Search ................................... 438/46, 507

(56) References Cited

U.S. PATENT DOCUMENTS

| 6,153,010 A | * | 11/2000 | Kiyoku et al. ................. 117/95 |
| 6,225,650 B1 | * | 5/2001 | Tadatomo et al. ........... 257/190 |
| 6,534,332 B2 | * | 3/2003 | Bourret-Courchesne ..... 438/47 |
| 2002/0066403 A1 | | 6/2002 | Sunakawa et al. | |

FOREIGN PATENT DOCUMENTS

| JP | 2000-077336 A | 3/2000 |
| JP | 2000-150388 A | 5/2000 |

* cited by examiner

Primary Examiner—David Nelms
Assistant Examiner—Quoc Hoang
(74) Attorney, Agent, or Firm—Leydig, Voit & Mayer, Ltd.

(57) ABSTRACT

The state of a surface of a substrate 11 or a GaN group compound semiconductor film 12 formed on the substrate 11 is modified with an anti-surfactant material and a GaN group compound semiconductor material is supplied by a vapor phase growth method to form dot structures made of the GaN group compound semiconductor on the surface of the semiconductor film 12, and the growth is continued until the dot structures join and the surface becomes flat. In this case, the dot structures join while forming a cavity 21 on an anti-surfactant region. A dislocation line 22 extending from the underlayer is blocked by the cavity 21, and therefore, the dislocation density of an epitaxial film surface can be reduced. As a result, the dislocation density of the GaN group compound semiconductor crystal can be reduced without using a masking material in the epitaxial growth, whereby a high quality epitaxial film can be obtained.

15 Claims, 2 Drawing Sheets (a)

(b)

(c)

METHOD FOR GROWING GAN COMPOUND SEMICONDUCTOR CRYSTAL AND SEMICONDUCTOR SUBSTRATE

CROSS REFERENCE TO RELATED APPLICATIONS

This patent application is divisional of U.S. patent application Ser. No. 09/937,337, filed Dec. 18, 2001, now U.S. Pat. No. 6,700,179, which is 371 of PCT/JP00/01718 filed on Mar. 21, 2000.

TECHNICAL FIELD

The present invention relates to a method of growing a GaN group compound semiconductor crystal and a semiconductor base using this crystal.

BACKGROUND ART

A GaN group compound semiconductor crystal is usually formed on a sapphire substrate and the like by epitaxial growth via a buffer layer, because a substrate that lattice matches therewith is difficult to obtain. In this case, a lattice defect such as dislocation is introduced from a growth interface due to a lattice mismatch between an epitaxial film and a substrate, and the surface of the epitaxial film always contains dislocations of an order of about $10^{10}$ cm$^{-2}$. The dislocation in the aforementioned epitaxial film causes a current leak in a device, non-radiative center and diffusion of electrode material. Therefore, a method for reducing dislocation density has been tried.

One of such methods is a method using a selective growth as described in JP-A-10-312971. According to this method, a masking material, such as $SiO_2$, is used to form a pattern on a substrate to allow a selective growth, and the growth is continued until this masking material is buried, thereby to effectively block dislocation with the masking material, or the propagation direction of dislocation is changed during crystal growth on the mask. As a result, the dislocation density is reduced.

However, the above-mentioned method is associated with a phenomenon in which the crystal axis of a crystal grown on the mask in the lateral direction relative to the growth plane to bury a masking material becomes inclined as the growth progresses, which phenomenon being called tilting. Since tilted crystals join on a mask, a new defect is generated there. What makes the crystal axis tilt is uncertain, but an influence of a masking material is considered to be present. A mask needs to be made after being once taken out from an epitaxial crystal growth apparatus. This could pose problems such as complicated steps, contamination of substrate, damage on a substrate surface and the like.

A high quality GaN substrate has been obtained in recent years by Halide Vapor Phase Epitaxy (HVPE) and the like. The substrate obtained thereby still has a dislocation density of $10^5$–$10^7$ cm$^{-2}$, and to make a high quality device, a still lower dislocation density is required as well as indispensable.

It is therefore an object of the present invention to provide a semiconductor base having a high quality epitaxial film and a reduced dislocation density, without using a masking material used for conventional selective growth, such as $SiO_2$, in epitaxial growth of a GaN group compound semiconductor crystal, and a method for growing the base. In particular, the present invention aims at providing a method for growing an epitaxial film having a higher quality by reducing the dislocation density of a GaN substrate having a relatively high quality.

DISCLOSURE OF THE INVENTION

The semiconductor base of the present invention characteristically comprises a semiconductor base comprising a substrate and a GaN group compound semiconductor crystal grown thereon, wherein the aforementioned semiconductor crystal comprises a layer having a greater dislocation density, and a layer adjacent thereto and having a relatively small dislocation density, and wherein an interface or a region, where an anti-surfactant material is fixed, exists between these layers.

A different semiconductor base of the present invention characteristically comprises an interface or a region, where an anti-surfactant material is fixed, directly on a substrate, and a GaN group compound semiconductor crystal grown thereon.

In these cases, the anti-surfactant material is preferably Si.

In the above-mentioned cases, moreover, a layer comprising the interface or region, where an anti-surfactant material is fixed, and the GaN group compound semiconductor crystal grown thereon may be formed in two or more multi-layers.

In the method for growing a GaN group compound semiconductor crystal of the present invention, the state of the surface of a substrate is modified with an anti-surfactant material, and a GaN group compound semiconductor material is supplied by a vapor phase growth method, thereby to form dot structures made of the GaN group compound semiconductor on the surface of the substrate, and the growth is continued until the dot structures join and make the surface flat.

According to the method for growing a GaN group compound semiconductor crystal of the present invention, a GaN group compound semiconductor film is formed on the surface of the aforementioned substrate, the state of the surface of the substrate is modified with an anti-surfactant material, a GaN group compound semiconductor material is supplied by a vapor phase growth method to form dot structures made of the GaN group compound semiconductor on the surface of the aforementioned GaN group compound semiconductor, and the growth is continued until the dot structures join and make the surface flat.

In each of the Figures, 11 is a substrate, 12 is a GaN group compound semiconductor crystal, 14 is a dot structure, 21 is a cavity, 22 is a dislocation line, 3 is an anti-surfactant material, S is an interface, on which an anti-surfactant material is fixed.

DETAILED DESCRIPTION OF THE INVENTION

The state of a surface of a GaN group compound semiconductor crystal is modified by supplying an anti-surfactant material to the crystal. The present inventors have found that the anti-surfactant material, which is fixed on the modified surface, prevents extension of the dislocation line. That is, the anti-surfactant material acts as a masking in the conventional art, thereby allowing crystal growth only from the area where the anti-surfactant material is not fixed. When the growth is continued, the anti-surfactant material is buried by the crystal growth in the lateral direction. Therefore, a layer located above the interface, where the anti-surfactant material is fixed, becomes a high quality semiconductor layer having reduced dislocation defects. When an anti-surfactant material is fixed directly on a substrate, the occurrence itself of a dislocation defect is suppressed, and therefore, a semiconductor layer having a high quality can be formed.

Figure 1:
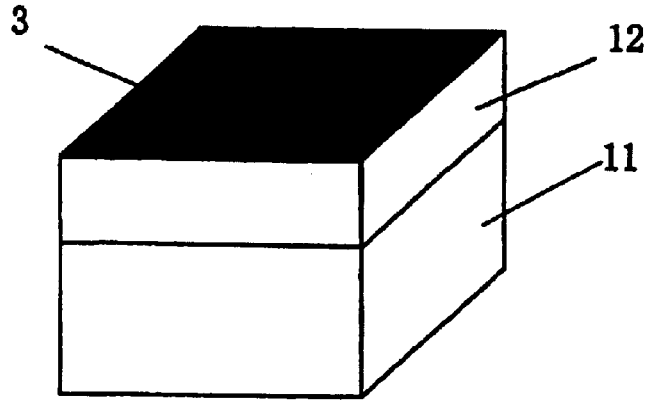
FIGS. 1(a)–1(c) is a schematic view showing the growth steps of the GaN group compound semiconductor crystal of the present invention.
Figure 1:
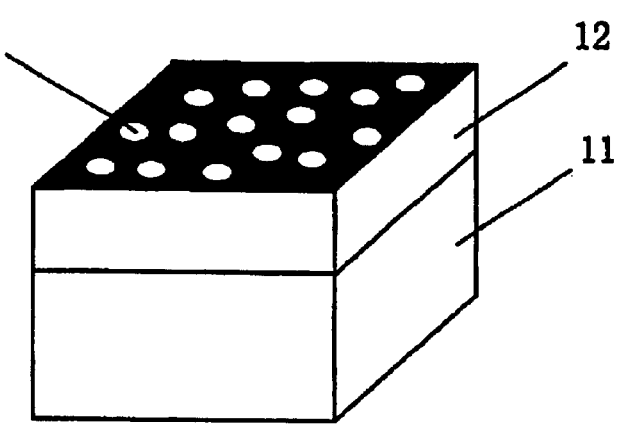
Figure 1:
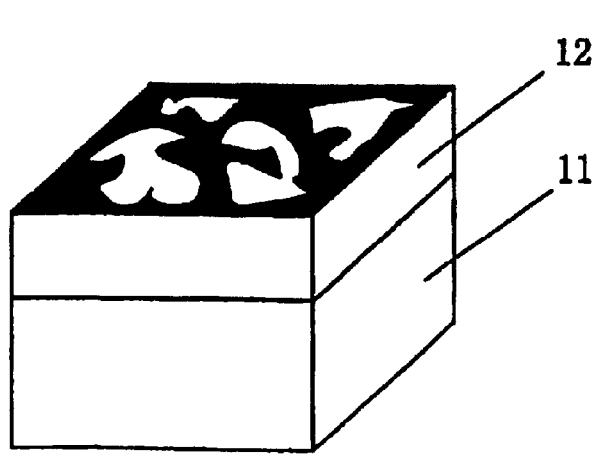

The embodiment of the present invention is explained in the following by referring to FIG. 1 and FIG. 2.

A GaN group compound semiconductor 12 is previously grown on a substrate 11, and a substance (anti-surfactant material) 3 to change the state of the surface is allowed to act on the surface (FIG. 1(a)). Sapphire, SiC, GaN, Si, ZnO, Spinel and the like can be used as the substrate. To let an anti-surfactant material act on the surface, the surface and the anti-surfactant material need only to be brought into contact. The contact method is not limited. When metal organic chemical vapor phase epitaxy (MOCVD) is used, for example, a GaN group compound semiconductor is grown on a substrate in an MOCVD apparatus, and an anti-surfactant material is supplied into the apparatus. The supply method may be a method for supplying a compound containing Si, such as tetraethyl silane (TESi), silane ($SiH_4$) and the like, as a gas.

By allowing an anti-surfactant material to act on a surface, many micro regions having high surface energy come to be present on the surface. That is, the anti-surfactant material is fixed on the surface of the substrate. When a GaN group compound semiconductor material is continuously supplied, a GaN group compound semiconductor does not grow easily from the region having a high surface energy, and a dot structure 14 is formed (FIG. 1(b)).

This phenomenon is also interpreted as covering of the crystal surface by fixing of the anti-surfactant material on a substrate by adsorption or chemical bonding, thereby to inhibit two-dimensional growth of GaN group crystal. That is, it acts as an $SiO_2$ mask used for selective growth, and such action can be obtained by using an anti-surfactant material such as Ge, Mg, Zn and the like. However, the use of Si is desirable because it avoids a problem of contamination of the crystal.

The dot structure in the present invention means a micro structure derived from a region where an anti-surfactant material does not act, or a region that does not inhibit GaN growth, which structure has various shapes of a polyhedric structure, a dome, a rod and the like, that are subject to change depending on crystal growth conditions, crystallinity of underlayer, distribution density of the anti-surfactant material and the like.

The density of the region where an anti-surfactant material acts can be controlled by the amount of supply of the anti-surfactant material, supply time, temperature of the substrate and the like.

When a GaN group compound semiconductor is continuously grown after the dot structures are formed, the dot structures start to join (FIG. 1(c)). The dot structures join while forming a cavity 21 on the anti-surfactant region (FIG. 2). Because the dot structures are formed by epitaxial growth from the micro opening regions, the probability of a dislocation line extending through this opening becomes extremely low, and the dislocation line 22 extending from the underlayer is blocked by this cavity part. As a result, the dislocation density of the surface of the epitaxial film is reduced.

Figure 2:
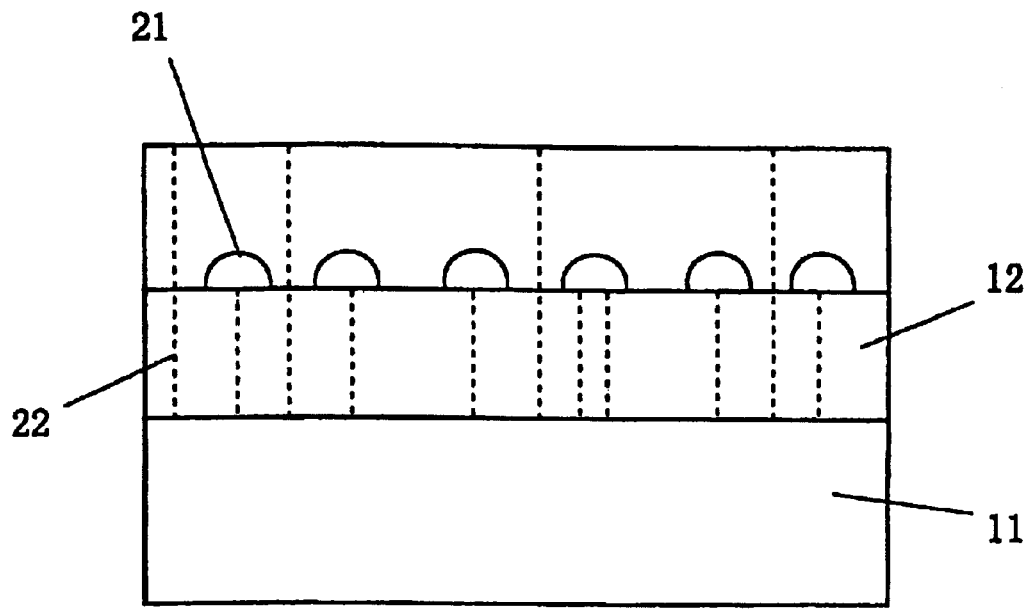
FIG. 2 is a schematic view showing a cross section of a GaN group compound semiconductor base prepared by the growth method of the present invention.
Figure 3:
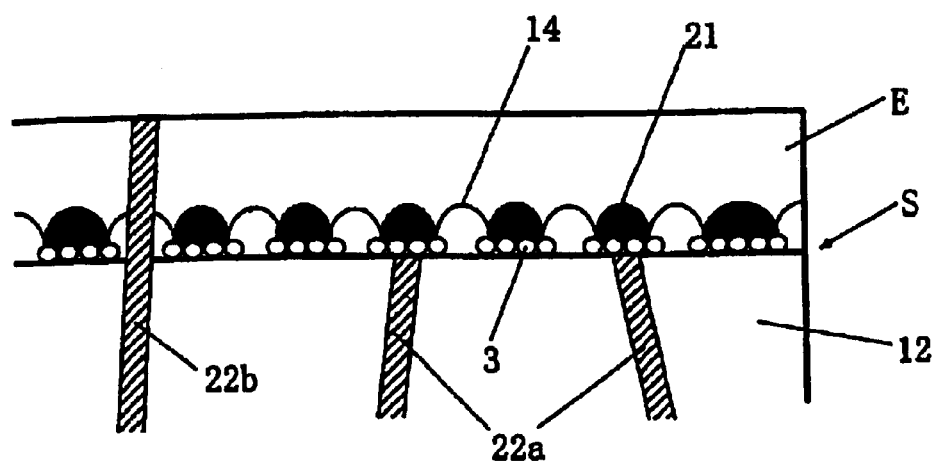
FIG. 3 is an enlarged sectional view containing the essential parts of FIG. 2.

FIG. 3 is an enlarged sectional view of the essential parts of FIG. 2 and shows the above-mentioned points in more detail. As shown therein, of the anti-surfactant material 3 is fixed at the atomic level on the surface of the GaN group compound semiconductor 12, into which the anti-surfactant material has been introduced. Crystal growth in this state does not accompany crystal growth on the part where the aforementioned anti-surfactant material 3 is fixed, and the dot structure 14 is formed in the non-fixing part as mentioned above. As the growth continues, growth in the so-called lateral direction occurs from each dot 14, and the adjacent dots join as they grow to achieve crystal growth in the thickness direction.

As a result, a cavity 21 is formed on the part where anti-surfactant material 3 is fixed, and the dislocation line 22a encountered with the part, where the anti-surfactant material 3 is fixed, stops extending. The dislocation line 22b, which extends toward the part, where the anti-surfactant material 3 is not fixed, continues to extend. As compared to the dislocation density of the GaN group compound semiconductor 12, a growth layer E laminated thereon is a high quality layer having a reduced dislocation density. That is, a semiconductor layer having a low dislocation density can be formed via an interface S, where the anti-surfactant material 3 is fixed.

When the interface S, where the anti-surfactant material 3 is fixed, is observed here closely with a Transmission Electron Microscope (TEM) and the like, the cavity 21 is mostly observed as a void of the order of several atom layers, or a discontinuity line of an atomic arrangement. The reduction rate of the dislocations in the interface varies depending on the degree of surface modification with the anti-surfactant material, but in most cases, reduction of not less than 90% is possible. Moreover, by repeatedly applying the aforementioned steps to the surface of the semiconductor crystal base obtained by the present invention, or by making a multi-layer structure comprising two or more layers of an interface or a region, where an anti-surfactant material is fixed, and a layer made of a GaN group compound semiconductor crystal grown thereon, low dislocation of the film is promoted to possibly provide an epitaxial film almost free of dislocation.

In the present invention, because a masking material, such as $SiO_2$, is not used, and the length of the growth in the lateral direction necessary for micro dot structures to join and grow into a thin film is extremely short, and because the time therefor is extremely short, the phenomenon of tilting, on the cavity 21, of the crystal axis (C axis) of a crystal grown in the lateral direction does not occur and a new defect is not produced.

One of the characteristics of a GaN group semiconductor is a column structure, where individual column structures have not only the aforementioned fluctuation of the C axis but also the fluctuation in the direction the C axis is rotated. According to the method of the present invention, fluctuation of the C axis can be suppressed and so can the fluctuation in the rotational direction. Therefore, the reduction effect on the dislocation by the growth in the lateral direction is far greater than the use of a masking material and other cases.

While a GaN group compound semiconductor was grown in advance on a substrate and an anti-surfactant material was made to act on the surface in the embodiment of the present invention, the anti-surfactant material may directly act on the surface of the substrate. In this case, a semiconductor base can be obtained by a method similar to the above-mentioned method except that an anti-surfactant material 13 is made to act directly on the substrate 11 without growing, in advance, the GaN group compound semiconductor 12 on the substrate 11 as in the above-mentioned embodiment. The GaN group compound semiconductor crystal grown on the substrate by this method becomes a high quality crystal layer having a small dislocation density.

EXAMPLES

The present invention is explained in detail in the following by referring to specific examples.

Example 1

A sapphire C-plane substrate was set in an MOCVD apparatus, and the temperature was raised to 1200° C. under a hydrogen atmosphere to allow thermal etching. Thereafter, the temperature was lowered to 500° C. and trimethyl aluminum (hereinafter TMA) as an Al ingredient material and ammonia as an N ingredient material were flown to grow 30 nm of an AlN low temperature buffer layer.

The growth temperature was raised to 1000° C. and trimethyl gallium (hereinafter TMG) as a Ga ingredient material and ammonia as an N ingredient material were flown to grow 1.5 μm of GaN. The supply of TMG and ammonia was stopped and with the growth temperature unchanged, $H_2$ as a carrier gas and tetraethyl silane containing Si as an anti-surfactant material were supplied to allow contact with the GaN surface for 10 seconds.

The supply of tetraethyl silane was stopped and TMG and ammonia were supplied again to form a GaN dot structure. The ingredient materials were supplied continuously thereafter and the growth was continued until the dots joined and the surface became flat after embedding.

The dislocation density of the GaN surface thus grown was measured and was found to be $10^7$ cm$^{-3}$. No occurrence of new defects above the cavity was observed in the cross section by TEM.

Example 2

In the same manner as above and using a GaN semiconductor crystal obtained in the above-mentioned Example 1 as a substrate, the steps of supplying tetraethyl silane as a source of an anti-surfactant material and crystal growth were repeated to give a GaN semiconductor crystal comprising five multi-layers of an interface and the anti-surfactant material fixed thereon.

The dislocation density of the GaN semiconductor crystal layer grown on the fifth interface was measured and found to have lowered to $10^2$ cm$^{-2}$.

Example 3

A GaN substrate having a dislocation density of $10^5$ cm$^{-2}$ was used as a substrate. This substrate was set in an MOCVD apparatus and the temperature was raised to 1100° C. (ammonia was simultaneously supplied when temperature was not less than 700° C.) under a hydrogen atmosphere to allow thermal etching. Thereafter, the temperature was lowered to 1050° C. and TMG as a Ga ingredient material and ammonia as an N ingredient material were flown to grow 2 μm of GaN. The supply of ingredient gasses was stopped and with the growth temperature unchanged, $H_2$ as a carrier gas and silane ($SiH_4$) as an anti-surfactant material were supplied to allow contact with the GaN surface for 15 seconds.

The supply of silane was stopped and TMG and ammonia were supplied again to grow 2 μm of GaN. Thereon was grown 100 nm of InGaN having an InN mixed crystal ratio of 20%. The number of pits that appeared on the surface of the InGaN layer obtained above was counted to evaluate the dislocation density, which was found to be $10^2$ cm$^{-2}$.

Example 4

According to the method of the above-mentioned Example 1–Example 3, a PIN type photodiode was prepared. The device structure was prepared by successively growing the following structures on the GaN bases prepared in the respective Examples from the fifth layer side.

first layer; p-$Al_yGa_{1-y}N$ (p=1×10$^{18}$ cm$^{-3}$, y=0.05, t=50 nm)
second layer; p-$Al_yGa_{1-y}N$ (p=5×10$^{17}$ cm$^{-3}$, y=0.1, t=0.2 μm)
third layer; non-doped GaN (t=2 μm)
fourth layer; n-$Al_yGa_{1-y}N$ (n=1×10$^{18}$ cm$^{-3}$, y=0.1, t=0.2 μm)
fifth layer; n-GaN (n=2×10$^{18}$ cm$^{-3}$, t=3 μm)

The three kinds of PIN photodiodes obtained in the above were compared with regard to the leak current at −10 V backward bias. The results are as shown in Table 1.

TABLE 1

|  | conventional | Example 1 | Example 2 | Example 3 |
|---|---|---|---|---|
| dark current (−10 V bias) | 5 μA | 1 nA | 10 pA | 5 pA |

The size of the element was 5 mm×5 mm. The conventional structure was formed on a sapphire substrate. The dislocation density then is assumed to be $10^9$ cm$^{-2}$.

Example 5

In the same manner as in Example 4, light emitting devices were successively grown on the GaN bases prepared by the methods of Example 1–Example 3 to give ultraviolet LEDs having a light emission wavelength of 375 nm. The light emitting device had the same SQW structure for all the three kinds.

A 20 mA current was flown through these light emitting elements and the light emitting output then was compared. The results are shown in Table 2.

TABLE 2

|  | conventional | Example 1 | Example 2 | Example 3 |
|---|---|---|---|---|
| Light emission output (at 20 mA current) | 3.5 mW | 7.0 mW | 9.2 mW | 9.5 mW |

INDUSTRIAL APPLICABILITY

As mentioned above, the growth method of the present invention can reduce the dislocation density without using a masking material. As a result, a high quality GaN group compound semiconductor crystal can be prepared. When a semiconductor light emitting element, a light receiving element and an electronic device, such as LED and LD, are formed thereon, the properties thereof are expected to be strikingly improved.

By the action of an anti-surfactant material, moreover, an effect practically commensurate with the selective growth can be obtained even without forming a pattern and the like. As a result, the steps of from an anti-surfactant treatment to the growth of a semiconductor layer can be sequentially performed in a growth apparatus, and the production process can be simplified.

This application is based on patent application Nos. 077239/1999 and 037577/2000 filed in Japan, the contents of which are hereby incorporated by reference.

What is claimed is:

1. A method for growing a GaN group compound semiconductor crystal, which method comprises:
   (i) modifying a state of a surface of a substrate with an anti-surfactant material,
   (ii) supplying a GaN group compound semiconductor material by a vapor phase growth method to form dot structures comprising the GaN group compound semiconductor on the surface of the substrate, and
   (iii) continuing the growth of the dot structures comprising the GaN group compound semiconductor until the dot structures join to make its surface flat,
   thereby growing the GaN group compound semiconductor crystal.

2. The method of claim 1, which method further comprises:
   (iv) modifying a state of a surface of the grown GaN group compound semiconductor crystal with an anti-surfactant material,
   (v) further growing the GaN group compound semiconductor crystal thereon, and
   (vi) optionally repeating steps (iv) and (v) one or more times,
   thereby forming two or more multi-layers of (a) an interface or region, where the anti-surfactant material is fixed, and (b) the GaN group compound semiconductor crystal grown on the interface or region.

3. The method of claim 1, wherein the anti-surfactant material is Si.

4. A method for growing a GaN group compound semiconductor crystal, which method comprises:
   (i) growing a GaN group compound semiconductor layer on a substrate,
   (ii) modifying a state of a surface of the GaN group compound semiconductor layer with an anti-surfactant material,
   (iii) supplying a GaN group compound semiconductor material by a vapor phase growth method to form dot structures comprising the GaN group compound semiconductor on the surface of the layer, and
   (iv) continuing the growth of the dot structures comprising the GaN group compound semiconductor until the dot structures join to make its surface flat,
   thereby growing the GaN group compound semiconductor crystal.

5. The method of claim 4, which method further comprises:
   (v) modifying the state of a surface of the grown GaN group compound semiconductor layer with an anti-surfactant material,
   (vi) further growing a GaN group compound semiconductor crystal thereon, and
   (vii) optionally repeating steps (v) and (vi) one or more times,
   thereby forming two or more multi-layers of (a) an interface or region, where the anti-surfactant material is fixed, and (b) the GaN group compound semiconductor crystal grown on the interface or region.

6. The method of claim 4, wherein the anti-surfactant material is Si.

7. A method for growing a GaN group compound semiconductor crystal, which method comprises:
   (i) contacting a gaseous compound containing an anti-surfactant material with a surface of a substrate to allow adsorption or chemical binding of atoms of the anti-surfactant material onto or with the surface of the substrate, and
   (ii) growing the GaN group compound semiconductor crystal.

8. The method of claim 7, which method further comprises:
   (iii) contacting a gaseous compound containing an anti-surfactant material with a surface of a crystal layer of the GaN group compound semiconductor crystal to allow adsorption or chemical binding of atoms of the anti-surfactant material onto or with the surface of the crystal layer,
   (iv) further growing the GaN group compound semiconductor crystal thereon, and
   (v) optionally repeating steps (iii) and (iv) one or more times,
   thereby forming two or more multi-layers of (a) an interface or region, where an anti-surfactant material is fixed, and (b) the GaN group compound semiconductor crystal grown on the interface or region.

9. The method of claim 7, wherein the anti-surfactant material is Si.

10. The method of claim 7, wherein the contacting of a gaseous compound containing an anti-surfactant material and subsequent growing of the GaN group compound semiconductor crystal are sequentially conducted within the same metal organic vapor phase epitaxy apparatus.

11. A method for growing a GaN group compound semiconductor crystal, which method comprises:
    (i) growing a GaN group compound semiconductor crystal layer on a substrate,
    (ii) contacting a gaseous compound containing an anti-surfactant material with a surface of the crystal layer to allow adsorption or chemical binding of atoms of the anti-surfactant material onto or with the surface of the crystal layer, and
    (iii) further growing the GaN group compound semiconductor crystal.

12. The method of claim 11, which method further comprises:
    (iv) contacting a gaseous compound containing an anti-surfactant material with a surface of a crystal layer of the GaN group compound semiconductor crystal to allow adsorption or chemical binding of atoms of the anti-surfactant material onto or with the surface of the crystal layer,
    (v) further growing the GaN group compound semiconductor crystal thereon, and
    (vi) optionally repeating steps (iv) and (v) one or more times,
    thereby forming two or more multi-layers of (a) an interface or region, where an anti-surfactant material is fixed, and (b) the GaN group compound semiconductor crystal grown on the interface or region.

13. The method of claim 11, wherein the anti-surfactant material is Si.

14. The method of claim 11, wherein the anti-surfactant material is Si, and the gaseous compound containing the anti-surfactant material is $SiR_4$.

15. The method of claim 11, wherein the contacting of a gaseous compound containing an anti-surfactant material and subsequent growing of the GaN group compound semiconductor crystal are sequentially conducted within the same metal organic vapor phase epitaxy apparatus.

* * * * *

UNITED STATES PATENT AND TRADEMARK OFFICE
CERTIFICATE OF CORRECTION

PATENT NO.    : 6,794,210 B2
DATED         : September 21, 2004
INVENTOR(S)   : Ouchi et al.

It is certified that error appears in the above-identified patent and that said Letters Patent is hereby corrected as shown below:

Title page,
Item [30], Foreign Application Priority Data, "11-077239" should read as
-- 1999-077239 --.

Column 8,
Line 60, "SiR$_4$" should read -- SiH$_4$ --.

Signed and Sealed this

First Day of March, 2005

JON W. DUDAS
*Director of the United States Patent and Trademark Office*